(12) United States Patent
Oh et al.

(10) Patent No.: US 12,447,579 B2
(45) Date of Patent: Oct. 21, 2025

(54) CHEMICAL MECHANICAL POLISHING VIBRATION MEASUREMENT USING OPTICAL SENSOR

(71) Applicant: Applied Materials, Inc., Santa Clara, CA (US)

(72) Inventors: Jeonghoon Oh, Saratoga, CA (US); Thomas H. Osterheld, Mountain View, CA (US); Steven M. Zuniga, Soquel, CA (US)

(73) Assignee: Applied Materials, Inc., Santa Clara, CA (US)

( * ) Notice: Subject to any disclaimer, the term of this patent is extended or adjusted under 35 U.S.C. 154(b) by 458 days.

(21) Appl. No.: 17/858,011

(22) Filed: Jul. 5, 2022

(65) Prior Publication Data
US 2023/0010759 A1  Jan. 12, 2023

Related U.S. Application Data

(60) Provisional application No. 63/218,887, filed on Jul. 6, 2021.

(51) Int. Cl.
*B24B 49/12* (2006.01)
*B24B 37/013* (2012.01)
(Continued)

(52) U.S. Cl.
CPC .......... *B24B 37/013* (2013.01); *B24B 37/042* (2013.01); *H01L 22/26* (2013.01);
(Continued)

(58) Field of Classification Search
CPC ..... B24B 37/013; B24B 37/042; H01L 22/26; H01L 21/30625; H01L 21/31053; H01L 21/3212

See application file for complete search history.

(56) References Cited

U.S. PATENT DOCUMENTS

| 5,240,552 A | 8/1993 | Yu et al. |
| 5,667,424 A * | 9/1997 | Pan .................. B24B 37/013 |
| | | 451/6 |

(Continued)

FOREIGN PATENT DOCUMENTS

| CN | 109202693 | 1/2019 |
| CN | 109968190 A | 7/2019 |

(Continued)

OTHER PUBLICATIONS

International Search Report and Written Opinion in International Appln. No. PCT/US2022/073439, mailed on Oct. 25, 2022, 13 pages.

(Continued)

*Primary Examiner* — Dale E Page
*Assistant Examiner* — Cristian A Tivarus
(74) *Attorney, Agent, or Firm* — Fish & Richardson P.C.

(57) ABSTRACT

A chemical mechanical polishing apparatus includes a platen to support a polishing pad, a carrier head to hold a substrate against a polishing surface of the polishing pad, a motor to generate relative motion between the platen and the carrier head so as to polish an overlying layer on the substrate, an in-situ vibration monitoring system including a light source to emit a light beam and a sensor that receives a reflection of the light beam from a reflective surface of the polishing pad, and a controller configured to detect exposure of an underlying layer due to the polishing of the substrate based on measurements from the sensor of the in-situ pad vibration monitoring system.

18 Claims, 4 Drawing Sheets

(51) Int. Cl.
    *B24B 37/04*        (2012.01)
    *H01L 21/66*        (2006.01)
    *H01L 21/306*      (2006.01)
    *H01L 21/3105*     (2006.01)
    *H01L 21/321*      (2006.01)

(52) U.S. Cl.
    CPC .. *H01L 21/30625* (2013.01); *H01L 21/31053* (2013.01); *H01L 21/3212* (2013.01)

(56) References Cited

U.S. PATENT DOCUMENTS

| | | |
|---|---|---|
| 6,488,569 B1 | 12/2002 | Wang et al. |
| 6,910,942 B1 | 6/2005 | Dornfeld et al. |
| 8,563,335 B1 * | 10/2013 | Benvegnu ............... H01L 22/12 438/692 |
| 11,007,618 B2 | 5/2021 | Murugesh et al. |
| 11,325,221 B2 | 5/2022 | Gadinski et al. |
| 11,701,749 B2 | 7/2023 | Swedek et al. |
| 2002/0173223 A1 | 11/2002 | Gitis et al. |
| 2003/0003845 A1 | 1/2003 | Adams et al. |
| 2003/0049993 A1 | 3/2003 | Fujii |
| 2003/0129931 A1 | 7/2003 | Konno et al. |
| 2006/0000807 A1 | 1/2006 | Golzarian |
| 2007/0218806 A1 | 9/2007 | Kistler |
| 2011/0016975 A1 | 1/2011 | Glaesemann et al. |
| 2014/0329439 A1 | 11/2014 | Chew et al. |
| 2015/0004888 A1 * | 1/2015 | Swedek ................. B24B 49/12 451/527 |
| 2016/0013085 A1 | 1/2016 | Chew et al. |
| 2016/0256978 A1 * | 9/2016 | Tang ..................... B24B 37/013 |
| 2019/0111542 A1 * | 4/2019 | Yun ....................... B24B 37/205 |
| 2019/0143474 A1 | 5/2019 | Wang et al. |
| 2019/0232459 A1 * | 8/2019 | Gadinski ................. B24B 37/24 |

FOREIGN PATENT DOCUMENTS

| | | |
|---|---|---|
| JP | H11-33910 | 2/1999 |
| JP | 2003-057027 | 2/2003 |
| JP | 2003-236749 | 8/2003 |
| JP | 2003-534649 A | 11/2003 |
| JP | 5301931 | 9/2013 |
| JP | 5301931 B2 * | 9/2013 |
| JP | 2018-065209 A | 4/2018 |
| JP | 2019-030934 A | 2/2019 |
| JP | 2020-010048 A | 1/2020 |
| KR | 20040083608 | 10/2004 |
| TW | 201529652 | 8/2015 |
| TW | 201922423 | 6/2019 |
| TW | 201945119 | 12/2019 |

OTHER PUBLICATIONS

Office Action for Taiwanese Appln. No. 111125317, dated May 25, 2023, 14 pages (with English Summary and Search Report).
Office Action in Japanese Appln. No. 2024-500054, dated Dec. 10, 2024, 12 pages (with English translation).
Office Action in Korean Appln. No. 10-2024-7003736, dated Jan. 22, 2025, 21 pages (with English translation).

\* cited by examiner

CHEMICAL MECHANICAL POLISHING VIBRATION MEASUREMENT USING OPTICAL SENSOR

CROSS-REFERENCE TO RELATED APPLICATIONS

This application claims the benefit of priority to U.S. Application No. 63/218,887, filed on Jul. 6, 2021, the contents of which are hereby incorporated by reference.

TECHNICAL FIELD

This specification relates to chemical mechanical polishing, and more specifically to measuring chemical mechanical polishing pad vibrations to detect layer transitions.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the metallic layer remaining between the raised pattern of the insulative layer form vias, plugs, and lines that provide conductive paths between thin film circuits on the substrate. For other applications, such as oxide polishing, the filler layer is planarized until a predetermined thickness is left over the nonplanar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

One problem in CMP is determining whether the polishing process is complete, e.g., whether a substrate layer has been planarized to a desired flatness or thickness, or when a desired amount of material has been removed. Variations in the slurry distribution, the polishing pad condition, the relative speed between the polishing pad and the substrate, and the load on the substrate can cause variations in the material removal rate. These variations, as well as variations in the initial thickness of the substrate layer, cause variations in the time needed to reach the polishing endpoint. Therefore, the polishing endpoint usually cannot be determined merely as a function of polishing time.

In some systems, the substrate is monitored in-situ during polishing, e.g., by monitoring the torque required by a motor to rotate the platen or carrier head. However, existing monitoring techniques may not satisfy increasing demands of semiconductor device manufacturers.

SUMMARY

In one aspect, a chemical mechanical polishing apparatus includes a platen to support a polishing pad, a carrier head to hold a substrate against a polishing surface of the polishing pad, a motor to generate relative motion between the platen and the carrier head so as to polish an overlying layer on the substrate, an in-situ vibration monitoring system including a light source to emit a light beam and a sensor that receives a reflection of the light beam from a reflective surface of the polishing pad, and a controller configured to detect exposure of an underlying layer due to the polishing of the substrate based on measurements from the sensor of the in-situ pad vibration monitoring system.

Advantages of implementations can include, but are not limited to, one or more of the following.

Disclosed herein is an apparatus and method for using an in-situ displacement monitoring system including a light source and a sensor which detect vibrations in the polishing pad of a chemical mechanical polishing apparatus. The detected vibrations correspond to motion induced by friction, e.g., releasing stress energy, between a substrate and slurry being moved over the grooved upper surface of a polishing pad. A vibration frequency domain analysis is determined based on the detected vibrations and the frequency domain analysis is monitored to determine a polishing endpoint, such as detecting the exposure of an underlying layer.

Monitoring the displacement at high sampling rates provides a broad spectrum resolution in the vibration profile. For example, monitoring the displacement at up to 350 kHz can provide vibration profile resolution in a range from sub-1 Hz to 175 kHz. Real-time frequency domain analysis enables precise and accurate detection of changes in the vibration profile corresponding to exposing underlying layers.

One or more of the following possible advantages may be realized. Exposure of an underlying layer can be detected more reliably. Polishing can be halted more reliably, and wafer-to-wafer uniformity can be improved.

The details of one or more embodiments are set forth in the accompanying drawings and the description below. Other features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

In some semiconductor chip fabrication processes an overlying layer, e.g., metal, silicon oxide or polysilicon, is polished until an underlying layer, e.g., a dielectric, such as silicon oxide, silicon nitride or a high-K dielectric, is exposed. During polishing of the overlying layers, friction between the slurry, substrate, and polishing pad create vibrations. For some applications, when the underlying layer is exposed, the vibration frequency spectrum changes. The polishing transition point can be determined by detecting this change in vibration. For example, an acoustic sensor can be mechanically coupled to the polishing pad. However, such monitoring techniques may not satisfy increasing demands of semiconductor device manufacturers. In particular, a consistent low-loss acoustic coupling between the polishing pad and the acoustic sensor can be difficult or expensive.

By generating a light beam and by measuring a reflection of the light beam from the polishing pad, it may be possible to measure vibrations of the polishing pad with less attenuation, and thus with reduced noise.

Figure 1:
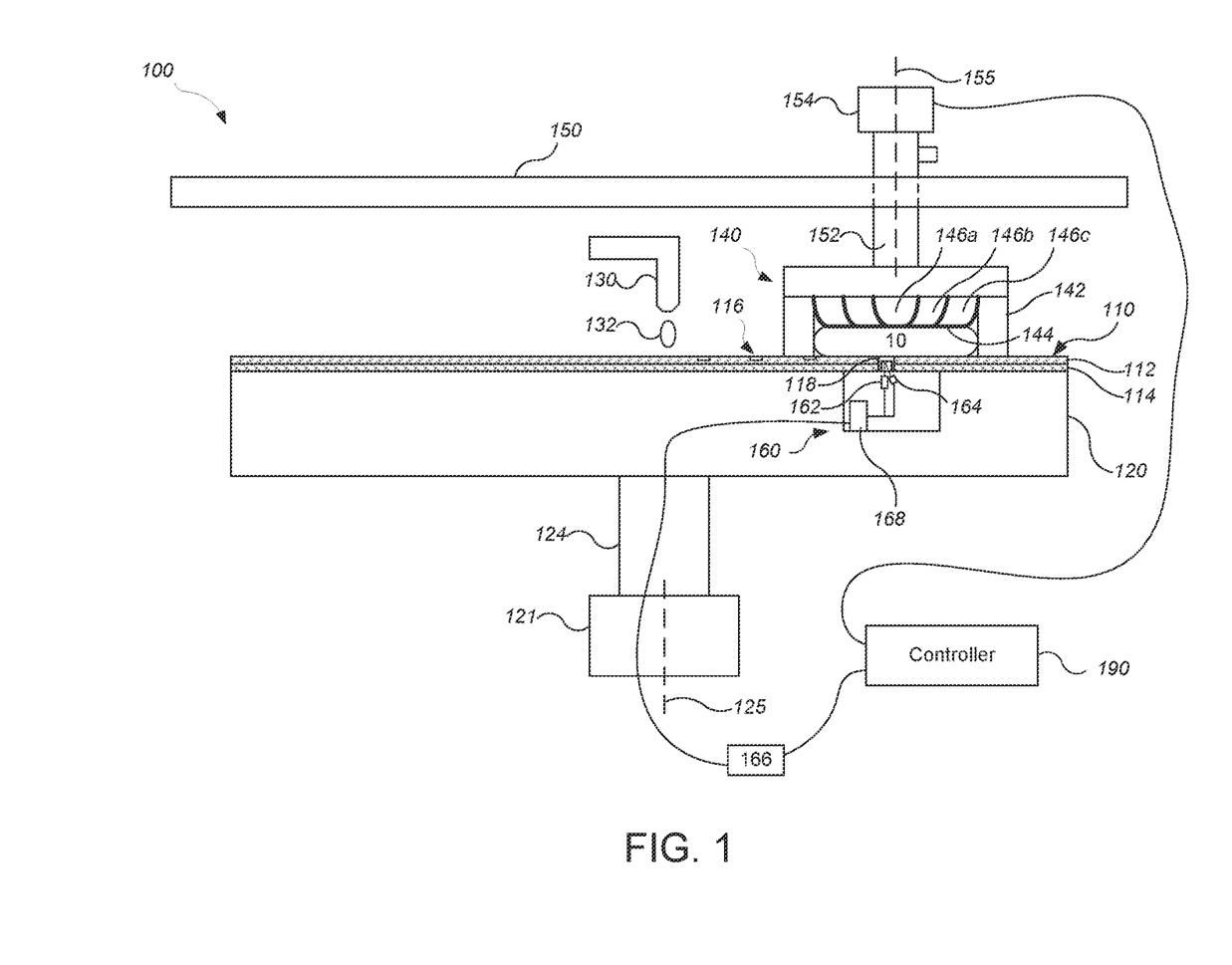
FIG. 1 illustrates a schematic cross-sectional view of an example of a polishing apparatus.

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121, e.g., a DC induction motor, can turn a drive shaft 124 to rotate the platen 120.

The polishing pad 110 can be a two-layer polishing pad with an outer polishing layer 112 and a softer backing layer 114. In some implementations, a plurality of slurry-transport grooves 116 (see FIG. 2A) are formed in the top surface of the polishing layer 112 of the polishing pad 110. The grooves 116 extend partially but not entirely through the thickness of the polishing layer 112. In general, the grooves 116 have a depth in a range from 25 mil to 30 mil (e.g., 0.025" to 0.030") from the polishing surface, e.g., top surface, of the polishing pad 110 and can be lower depending on polishing pad 110 wear following a number of polishing operations.

The polishing apparatus 100 can include a port 130 to dispense polishing liquid 132, such as abrasive slurry, onto the polishing pad 110. The polishing apparatus can also include a polishing pad conditioner to abrade the polishing pad 110 to maintain the polishing pad 110 in a consistent abrasive state.

The polishing apparatus 100 includes at least one carrier head 140. The carrier head 140 is operable to hold a substrate 10 against the polishing pad 110. Each carrier head 140 can have independent control of the polishing parameters, for example pressure, associated with each respective substrate.

The carrier head 140 can include a retaining ring 142 to retain the substrate 10 below a flexible membrane 144. The carrier head 140 also includes one or more independently controllable pressurizable chambers defined by the membrane, e.g., three chambers 146a-146c, which can apply independently controllable pressure to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or track, and is connected by a drive shaft 152 to a carrier head rotation motor 154, e.g., a DC induction motor, so that the carrier head can rotate about an axis 155. Optionally each carrier head 140 can oscillate laterally, e.g., on sliders on the carousel 150, or by rotational oscillation of the carousel itself, or by sliding along the track. In typical operation, the platen is rotated about its central axis 125, and each carrier head is rotated about its central axis 155 and translated laterally across the top surface of the polishing pad.

A controller 190, such as a programmable computer, is connected to the motors 121, 154 to control the rotation rate of the platen 120 and carrier head 140. For example, each motor can include an encoder that measures the rotation rate of the associated drive shaft. A feedback control circuit, which could be in the motor itself, part of the controller, or a separate circuit, receives the measured rotation rate from the encoder and adjusts the current supplied to the motor to ensure that the rotation rate of the drive shaft matches at a rotation rate received from the controller.

The vibrations of the polishing pad to be monitored can be caused by acoustic energy release when the slurry, polishing pad, or substrate material undergoes deformation during polishing, and the resulting vibration frequency spectrum is related to the material properties of the slurry, polishing pad, and/or substrate. Without being limited to any particular theory, possible sources of this energy, also termed "stress energy", and its characteristic frequencies include breakage of chemical bonds, characteristic phonon frequencies, slip-stick mechanisms, etc. The vibrations generated during polishing can include noise generated by friction of the substrate against the polishing pad (which is also sometimes referred to as an acoustic signal), or noise generated by cracking, chipping, breakage or similar generation of defects on the substrate.

The vibrations can be monitored by optically monitoring displacement of a portion of the polishing pad. Measuring the displacement using an light source (e.g., a laser) provides high accuracy and high frequency monitoring of the vibrations. The optical monitoring system can detect small displacements of a surface of the polishing pad at a high sampling rate (e.g., greater than 300 kHz) which facilitates a precise reconstruction of the polishing pad vibrations. Additionally, there is no intervening medium or mechanical coupling between the projected light and the bottom surface of the insert 118, allowing direct measurements of the vibrations with little loss or added noise from the air within the recess 117.

A position sensor, e.g., an optical interrupter connected to the rim of the platen or a rotary encoder, can be used to sense the angular position of the platen 120. This permits only portions of the signal measured when the light source 162 is in proximity to the substrate, e.g., when the light source 162 is below the carrier head or substrate, to be used in endpoint detection.

The polishing apparatus 100 includes at least one in-situ vibration monitoring system 160. In particular, the in-situ vibration monitoring system 160 can be configured to detect vibrations in the polishing pad 110 caused by stress energy when the material of the substrate 10 undergoes deformation. The vibrations travel through the backing layer 114 and polishing layer 112 of the polishing pad 110 and can be detected by the in-situ pad vibration monitoring system 160.

The in-situ vibration monitoring system 160 includes a displacement sensor assembly that includes a light source 162 positioned to direct light to a location on the bottom surface of the polishing pad and a detector 164 to detect reflections of the light from the polishing pad. In some implementations, the in-situ vibration monitoring system 160 includes multiple displacement sensor assemblies, so that vibration can be monitored at multiple locations on the polishing pad, e.g., multiple locations located equidistant from the axis of rotation 125 and/or evenly spaced around the axis of rotation 125.

Figure 2A:
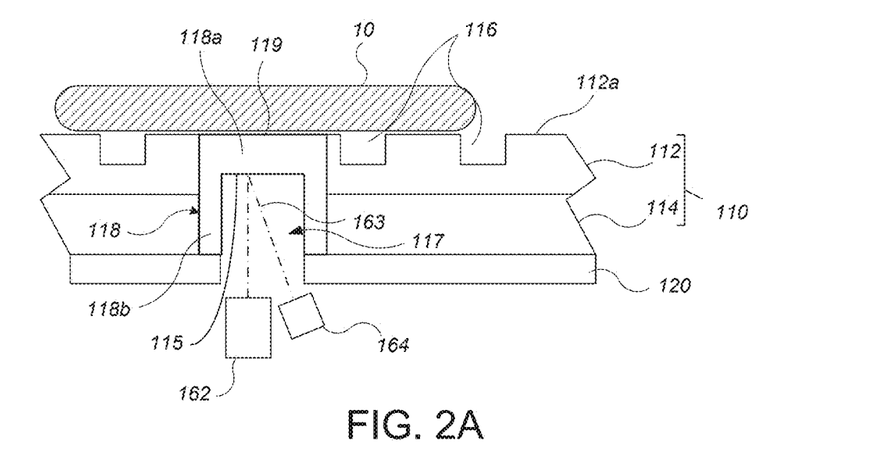
FIG. 2A illustrates a schematic cross-sectional view of a vibration monitoring sensor that monitors an insert in a polishing pad.

In the implementation shown in FIGS. 1 and 2A, the polishing pad 110 includes an insert 118 secured in and extending through the polishing layer 112 such that an upper surface 119 of the insert 118 and the top-most surface, e.g., a polishing surface 112a, of the polishing layer 112 are coplanar, so that the upper surface 119 will contact the substrate 10 in operation. In some implementations, as shown in FIG. 2A, the insert 118 extends through both the polishing layer and the backing layer 114. In some implementations, such as the implementations of FIG. 2B, the insert extends through the polishing layer 112, but does not extend into the backing layer 114. Rather, a void 114a in the backing layer 114 is positioned beneath the insert 118.

The insert 118 is generally cylindrical though other shapes are possible. As shown in FIG. 2A, the insert 118 can be drum-shaped, with a membrane 118a and annular side walls 118b extending downwardly from the outer edges of the membrane 118a. The membrane 118a can be thinner than the polishing layer 112. The thickness of the membrane 118a can be between 20% and 90% of the thickness of the polishing layer 112. The bottom edges of the side walls 118b can rest against the top of the platen 120.

Figure 2B:
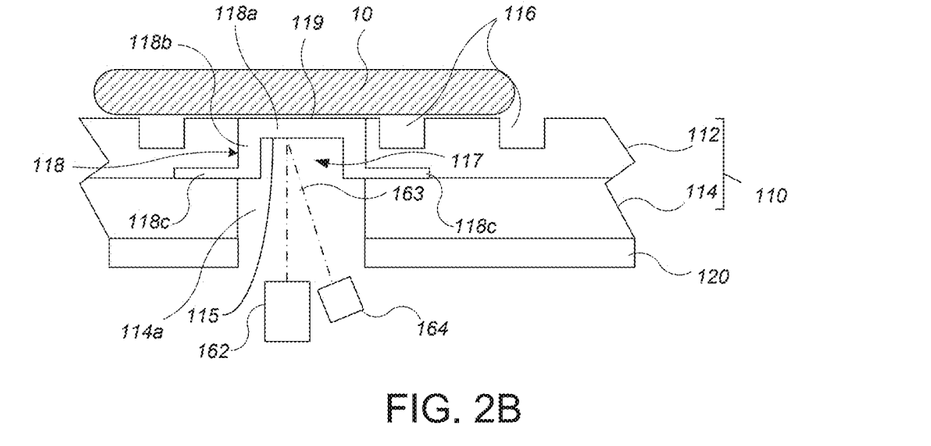
FIG. 2B illustrates a schematic cross-sectional view of another implementation of a vibration monitoring sensor that monitors an insert through the polishing pad.

Optionally, as shown in FIG. 2B, a flange 118c, e.g., an annular flange, can extend radially outward from the bottom edge of the annular side wall 118b. The annular flange 118b can be trapped between the polishing layer 112 and the backing layer 114, or between the backing layer 114 and the platen 120. In some implementations, the flange 118b is affixed to the backing layer 114 with an adhesive, or an adhesive tape to increase the stability of the insert 118 against the backing layer 114.

In some implementations, the insert 118 outer diameter (e.g., edge-to-edge) is in a range from 10 mm to 20 mm (e.g., 12 mm, 14 mm, 16 mm, or 18 mm). The insert 118 includes recess 117. The recess 117 diameter is lower than the insert 118 outer diameter and defines a void within the insert 118. The recess 117 diameter can be in a range from 8 mm to 18 mm (e.g., 10 mm, 12 mm, 14 mm, or 16 mm). The insert 118 is composed of a material with similar durometer to the surrounding backing layer 114 and/or polishing layer 112 which can reduce differential polishing as the substrate 10 passes over the insert 118 during a polishing operation. In some implementations, the insert 118 is composed of a material of the same durometer as the backing layer 114 and/or polishing layer 112. In some implementations, the insert 118 is composed of a material that is resistant to chemical interaction, such as chemicals present in the liquid 132.

In some implementations, one or more layers of the polishing pad 110 are porous, such as the backing layer 114 and/or the polishing layer 112. In such implementations, the insert 118 is a solid material being substantially non-porous such that vibrations induced at the upper surface 119 are transmitted to a reflective surface 115 without acoustic loss such as vibrations traveling through a porous medium.

The upper interior surface of the recess 117 includes a coating, or is composed of a material, which constitutes the reflective surface 115. The reflective surface 115 can be provided by a metallic foil, metallization coating, etc., on the upper interior surface of the recess 117. In some implementations, the reflective surface 115 reflects at least 90% of light contacting the reflective surface 115 in the optical wavelength range (e.g., at least 90%, at least 92%, at least 95%) used by the in-situ vibration monitoring system 160. The construction of the insert 118 structurally connects the upper surface 119 to the reflective surface 115 such that vibrations caused by stress energy transmit from the upper surface 119 to the reflective surface 115.

The membrane 118a thickness, e.g., the distance between the upper surface 119 and the reflective surface 115, can be in a range from 10 mil to 30 mil (e.g., 0.010" to 0.030"). In some implementations, the upper surface 119 thickness is 20 mil (e.g., 0.020"). Reduced thickness of the membrane 118a increases vibration detection sensitivity while increased thickness increase insert 118 durability and product life span.

The reflective surface 115 is planar and spans at least a portion of the recess 117 upper surface parallel with the polishing layer and the polishing pad 110 lower surface. The reflective surface 115 can span the recess 117 upper surface in a range from 10% to 100% of the surface area (e.g., 10% or greater, 30% or greater, 50% or greater, 70% or greater, 90% or less, 70% or less, 50% or less, 30% or less, 20% or less, or 100%). In some implementations, the reflective surface 115 can have a width in a range from 8 mm to 18 mm (e.g., 10 mm, 12 mm, 14 mm, or 16 mm).

The light source 162 emits a light beam 163 directed toward the reflective surface 115. In some implementations, the light beam 163 is continuous, and in alternative implementations, the light beam 163 is discontinuous, e.g., pulsed. In some implementations, the light source 162 emits a collimated light beam 163 of a single wavelength, e.g., the light source 162 is a laser. The in-situ vibration monitoring system 160 includes a sensor 164 positioned to receive light 163 scattered from the reflective surface 115. Vibrations from the membrane 118a translate to displacement of the reflective surface 115. The displacement changes the position at which the light 163 is received by the sensor 164. The sensor 164 generates a signal based upon the received beam 163. The sensor 164 is in electronic communication with circuitry 168 and transmits the signal to circuitry 168.

The sensor 164 can be connected by circuitry 168 to a power supply and/or other signal processing electronics 166 through a rotary coupling, e.g., a mercury slip ring. The signal processing electronics 166 can be connected in turn to the controller 190. In some implementations, the signal from the sensor 164 can be amplified by a built-in internal amplifier. The signal from the sensor 164 can then be further amplified and filtered if necessary, and digitized through an A/D port to a high speed data acquisition board, e.g., in the electronics 166. Data from the sensor 164 can be recorded at 100 to 400 kHz. In some implementations, data from the sensor 164 is collected at 392 kHz. Data collected at higher rates (e.g., greater than 100 kHz) provides information on higher frequency vibrations and increases reproduction of lower frequency components in the vibration.

In some implementations, the light source 162, sensor 164, circuitry 168, and/or signal processing electronics 166 are included in a single instrument, such as for example, a LK-G5000 sensor head and controller manufactured by Keyence.

Figure 2C:
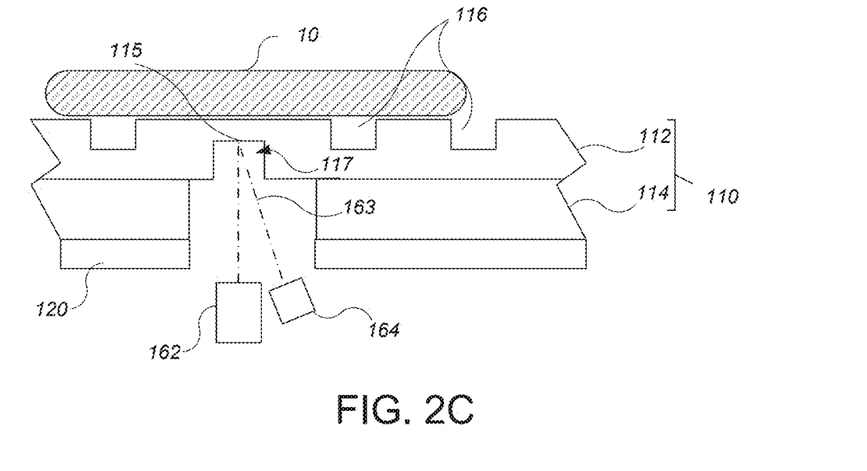
FIG. 2C illustrates a schematic cross-sectional view of another implementation of a vibration monitoring sensor that engages a portion in the polishing pad.

In FIG. 2C, rather than a separate insert, a recess 117 is manufactured in the polishing layer 112 itself. The upper interior surface of the recess 117 is provided with the reflective surface 115. In such implementations, the polishing layer 112 above the reflective surface 115 and recess 117 is continuous. The depth of the recess 117 be between 10% and 80% of the thickness of the polishing layer 112. Lower values provide increased durability of the polishing layer 112 above the recess 117, whereas higher values provide increased signal from the light beam 163 as detected by the sensor 164. In some implementations, the polishing pad 110 includes a portion above the recess 117 composed of a non-porous material to reduce the vibration signal noise, e.g., through reflection and attenuation.

Figure 3:
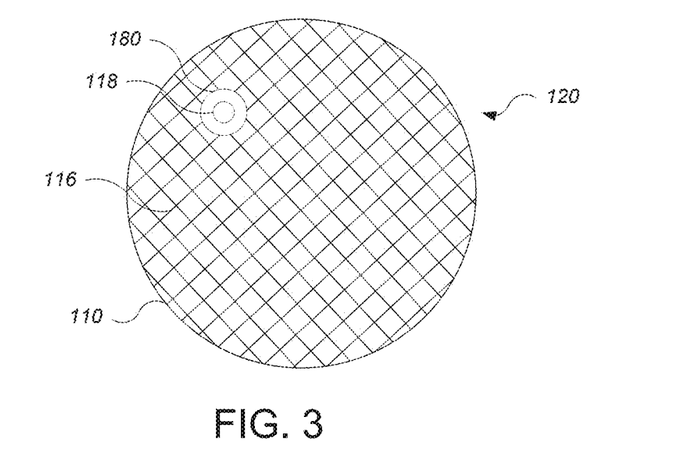
FIG. 3 illustrates a schematic cross-sectional view of another implementation of a vibration monitoring sensor that engages a portion in the polishing pad.

In addition, referring to FIG. 3, a top view of the polishing pad 110 is shown including grooves 116, insert 118, and a portion 180 of the polishing layer 112 surrounding the insert 118. In some implementations, the portion 180 is flat, i.e., lacks the grooves, and is coplanar with the top surface of the surrounding polishing layer 112. Implementations including a portion 180 around the insert 118 can reduce transmitted vibrations through the insert 118 due to interaction with the edges of the grooves 116 of the remaining polishing pad 110. In some implementations, the portion 180 is composed of the same material as the insert 118. In some alternative implementations, the portion 180 is composed of a non-porous material, such as the material of the insert 118.

The insert 118 and in-situ pad vibration monitoring system 160 therebelow can be located at the center of the platen 120, e.g., at the axis of rotation 125, at the edge of the platen 120, or at a midpoint (e.g., 5 inches from the axis of rotation for a 20 inch diameter platen).

As the portion 180 of the polishing pad rotates under the substrate 10, referring to FIGS. 1 and 3, the stick/slip action, e.g., stress energy release, between the portion 180 and the substrate 10 will cause vibration characteristics. However, because the portion 180 and sensor 162 are free standing from the rest of the polishing pad 110 and platen 120, the sensor can pick up the vibration behavior selectively from the pad portion 180.

The signal received by the sensor 164 from the light source 162, e.g., after amplification, preliminary filtering and digitization, can be subject to data processing, e.g., in the controller 190, for either endpoint detection, or feedback or feedforward control. In some implementations, the controller 190 determines the exposure of an underlying layer.

In some implementations, a frequency analysis of the signal is performed. For example, a Fast Fourier Transform (FFT) can be performed on the signal to generate a frequency spectrum. A particular frequency band can be monitored, and if the intensity in the frequency band crosses a threshold value, this can indicate exposure of an underlying layer, which can be used to trigger endpoint. Alternatively, if the width of a local maxima or minima in a selected frequency range crosses a threshold value, this can indicate exposure of an underlying layer, which can be used to trigger endpoint.

As another example, a wavelet packet transform (WPT) can be performed on the signal to decompose the signal into a low-frequency component and a high frequency component. The decomposition can be iterated if necessary to break the signal into smaller components. The intensity of one of the frequency components can be monitored, and if the intensity of the component crosses a threshold value, this can indicate exposure of an underlying layer, which can be used to trigger endpoint.

Detection of the polishing endpoint triggers halting of the polishing, although polishing can continue for a predetermined amount of time after endpoint trigger. Alternatively or in addition, the data collected and/or the endpoint detection time can be fed forward to control processing of the substrate in a subsequent processing operation, e.g., polishing at a subsequent station, or can be fed back to control processing of a subsequent substrate at the same polishing station.

Figure 4:
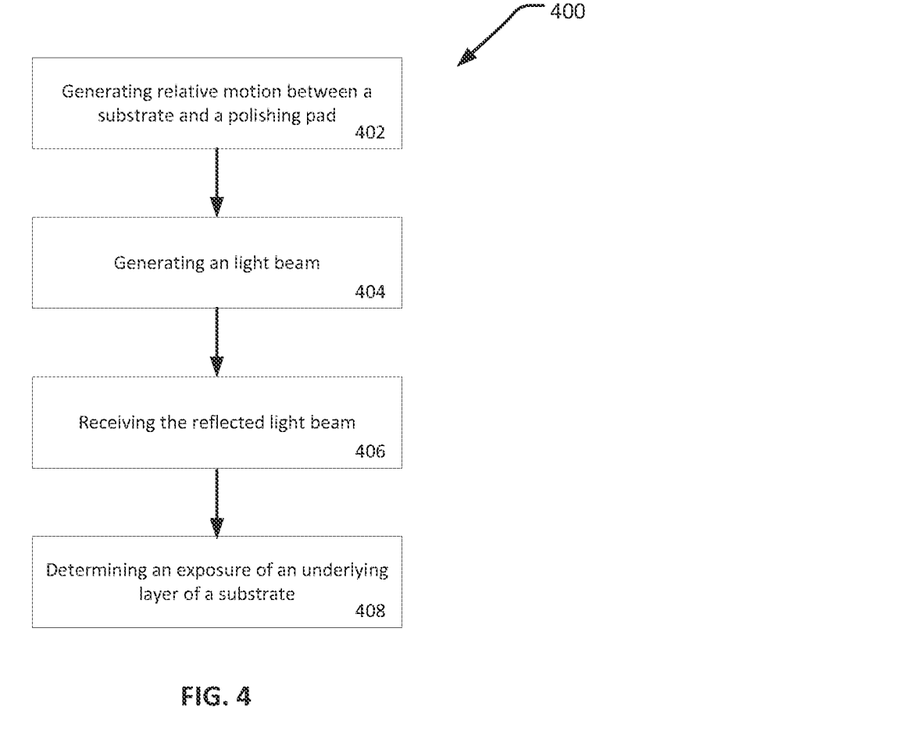
FIG. 4 illustrates a flow chart diagram depicting the steps of determining an exposure of an underlying layer of a substrate using reflected optical signals.

FIG. 4 is a flow chart diagram depicting the steps of determining an exposure of an underlying layer of a substrate using reflected optical signals. The substrate is polished by the polishing pad (step 402). This can include holding the substrate in the carrier head and bringing the substrate into contact with the polishing surface, and generating relative motion between the substrate and polishing pad, e.g., by rotating the platen and carrier head. As the substrate undergoes relative motion with the polishing pad, energy is released between the slurry, polishing pad, or substrate material undergoes deformation during polishing, and the resulting vibration frequency spectrum is transmitted from the polishing surface to an underside of the polishing layer.

A light source generates a light beam which (step 404) is directed toward a reflective surface 115 on the bottom of the polishing pad 110. A sensor receives the reflected light beam (step 406) and based on the received reflected light beam generates a signal.

The controller 190 determines an exposure of an underlying layer of the substrate 10 (step 408) based on the vibration frequency spectrum. The determining can include performing a Fast Fourier Transform (FFT), or a wavelet packet transform (WPT), on the signal to determine a vibration frequency spectrum. For example, the total power in a preset wavelength range can be monitored. If the controller 190 detects that the monitored power crosses a preset threshold then the controller 190 can generate a signal that indicates exposure of the underlying layer. In response to the signal, the controller 190 modifies the processing process, e.g., halt polishing, change applied pressure to the substrate, or modify the supplied polishing liquid. The in-situ pad vibration monitoring system 160 and/or controller 190 can perform additional or alternative data processing on the signal, or on the vibration frequency spectrum as described herein.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The above described polishing apparatus and methods can be applied in a variety of polishing systems. Either the polishing pad, or the carrier head, or both can move to provide relative motion between the polishing surface and the wafer. For example, the platen may orbit rather than rotate. The polishing pad can be a circular (or some other shape) pad secured to the platen. Some aspects of the endpoint detection system may be applicable to linear polishing systems (e.g., where the polishing pad is a continuous or a reel-to-reel belt that moves linearly). The polishing layer can be a standard (for example, polyurethane with or without fillers) polishing material, a soft material, or a fixed-abrasive material. Terms of relative positioning are used; it should be understood that the polishing surface and wafer can be held in a vertical orientation or some other orientations.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A chemical mechanical polishing apparatus, comprising:
   a platen to support a polishing pad;
   a carrier head to hold a substrate against a polishing surface of the polishing pad;
   a motor to generate relative motion between the platen and the carrier head so as to polish an overlying layer on the substrate;
   an in-situ pad vibration monitoring system including a light source to emit a light beam and a sensor that receives a reflection of the light beam from a reflective surface parallel with a polishing surface of the polishing pad; and
   a controller configured to detect exposure of an underlying layer due to the polishing of the substrate based on measurements from the sensor of the in-situ pad vibration monitoring system, the measurements indicative of a vibration of the reflective surface in a direction normal to the polishing surface.

2. The apparatus of claim 1, comprising the polishing pad, and wherein the reflective surface is recessed from a lower surface of the polishing pad.

3. The apparatus of claim 2, wherein the polishing pad comprises an insert and an upper surface of the insert is coplanar with an upper surface of the polishing pad, and the reflective surface is housed within the insert.

4. The apparatus of claim 3, wherein the polishing pad comprises a porous material and the insert comprises a non-porous material.

5. The apparatus of claim 3, wherein a distance between the upper surface and the reflective surface of the insert is in a range between from 10 mil to 30 mil.

6. The apparatus of claim 3, wherein the reflective surface of the insert has a width in a range between from 8 mm to 18 mm.

7. The apparatus of claim 3, wherein the insert comprises a durometer value within 10 Shore of a polishing pad durometer value.

8. The apparatus of claim 3, wherein the polishing pad has a polishing layer and a plurality of slurry-transport grooves in a polishing surface of the polishing layer, and wherein the insert is positioned in a portion of the polishing pad lacking a slurry-transport groove.

9. The apparatus of claim 1, wherein the controller is configured to:
   perform a frequency domain analysis of the measurements received from the sensor of the in-situ pad vibration monitoring system.

10. The apparatus of claim 2, wherein the controller is configured to detect a polishing endpoint based on the frequency domain analysis.

11. The apparatus of claim 1, wherein the controller is configured to, in response to the measurements from the sensor of the in-situ pad vibration monitoring system:
    adjust a current pressure of the carrier head; or
    adjust a baseline pressure of a subsequent polishing of a new substrate.

12. The apparatus of claim 1, wherein the sensor is configured to receive the reflected light beam at a sampling frequency of 250 kHz or more.

13. The apparatus of claim 1, wherein the sensor is configured to receive the reflected light beam at a sampling frequency of 395 kHz.

14. A method, comprising:
- generating relative motion between a substrate and a polishing pad of a chemical mechanical polishing apparatus;
- generating a light beam, wherein the light beam is reflected from a reflective surface parallel with a polishing surface of the polishing pad;
- receiving the reflected light beam with a sensor of the chemical mechanical polishing apparatus; and
- determining a polishing endpoint of a substrate supported by the chemical mechanical polishing apparatus based on the reflected light beam, wherein the reflected light beam is indicative of a vibration of the reflective surface in a direction normal to the polishing surface.

15. The method of claim 14, further comprising determining a frequency domain analysis of the reflected light beam.

16. The method of claim 15, wherein the determining the polishing endpoint is based on the frequency domain analysis.

17. The method of claim 15, wherein the determining a frequency domain analysis comprises performing a Fast Fourier Transform (FFT), or a wavelet packet transform (WPT).

18. The method of claim 15, further comprising:
- adjusting a current pressure of a carrier head; or
- adjusting a baseline pressure of a subsequent polishing of a new substrate based upon the frequency domain analysis.

* * * * *

UNITED STATES PATENT AND TRADEMARK OFFICE
CERTIFICATE OF CORRECTION

Page 1 of 1

PATENT NO. : 12,447,579 B2
APPLICATION NO. : 17/858011
DATED : October 21, 2025
INVENTOR(S) : Jeonghoon Oh, Thomas H. Osterheld and Steven M. Zuniga It is certified that error appears in the above-identified patent and that said Letters Patent is hereby corrected as shown below:

In the Claims

In Column 10, Line 59, Claim 10, delete "claim 2," and insert --claim 9,--.

Signed and Sealed this
Tenth Day of February, 2026

John A. Squires
*Director of the United States Patent and Trademark Office*